(12) United States Patent
Litovsky

(10) Patent No.: US 8,115,470 B1
(45) Date of Patent: Feb. 14, 2012

(54) BROADBAND ISOTROPIC ANTENNA

(76) Inventor: Roman N. Litovsky, Newton, MA (US)

( * ) Notice: Subject to any disclaimer, the term of this patent is extended or adjusted under 35 U.S.C. 154(b) by 821 days.

(21) Appl. No.: 12/231,562

(22) Filed: Sep. 4, 2008

Related U.S. Application Data

(60) Provisional application No. 60/994,305, filed on Sep. 19, 2007.

(51) Int. Cl.
G01R 31/02 (2006.01)
G01R 31/00 (2006.01)

(52) U.S. Cl. .......................................... 324/72; 324/96

(58) Field of Classification Search ............... 324/76.19, 324/72, 96
See application file for complete search history.

(56) References Cited

U.S. PATENT DOCUMENTS

| 4,365,192 A | * | 12/1982 | Rankin et al. .................. 324/72 |
| 5,923,170 A | * | 7/1999 | Kuckes ......................... 324/326 |
| 2008/0318541 A1 | * | 12/2008 | Kimoto ....................... 455/277.1 |

* cited by examiner

Primary Examiner — Amy He
(74) Attorney, Agent, or Firm — Joanne M. Martin

(57) ABSTRACT

Broadband isotropic (omnidirectional) antenna typically comprising three orthogonal small size monopole antennas protruding through the centers of three adjacent sides of the small metal cube. Each antenna has the frequency correcting network and RF amplifier. Signals from all three antennas are commutated by the RF switch (multiplexer) and the output can be applied to any RF spectrum analyzer. It is shown that if spectrum analyzer sweeps at relatively slow rate or is used in max/hold mode, the resulting display is proportional to the magnitude of the electromagnetic field vector independent of the orientation of the monopole antennas with respect to the E-field direction. Another embodiment improves the circuit accuracy in case when one dominant RF signal is present. Also there is a disclosure of the technical details of the RF design that allow improved low noise antenna performance (signal blanker, synchronized with multiplexer control), and mechanical design of the PCB—triangle shape that coincides with diagonal plane of the antenna metal cube body which connects to the feed points of each of the 3 antennas yet is different from the plane of each of the 3 antennas, thus allowing all three antenna related circuits to be in one plane while being directly connected to the antenna feed points.

20 Claims, 6 Drawing Sheets

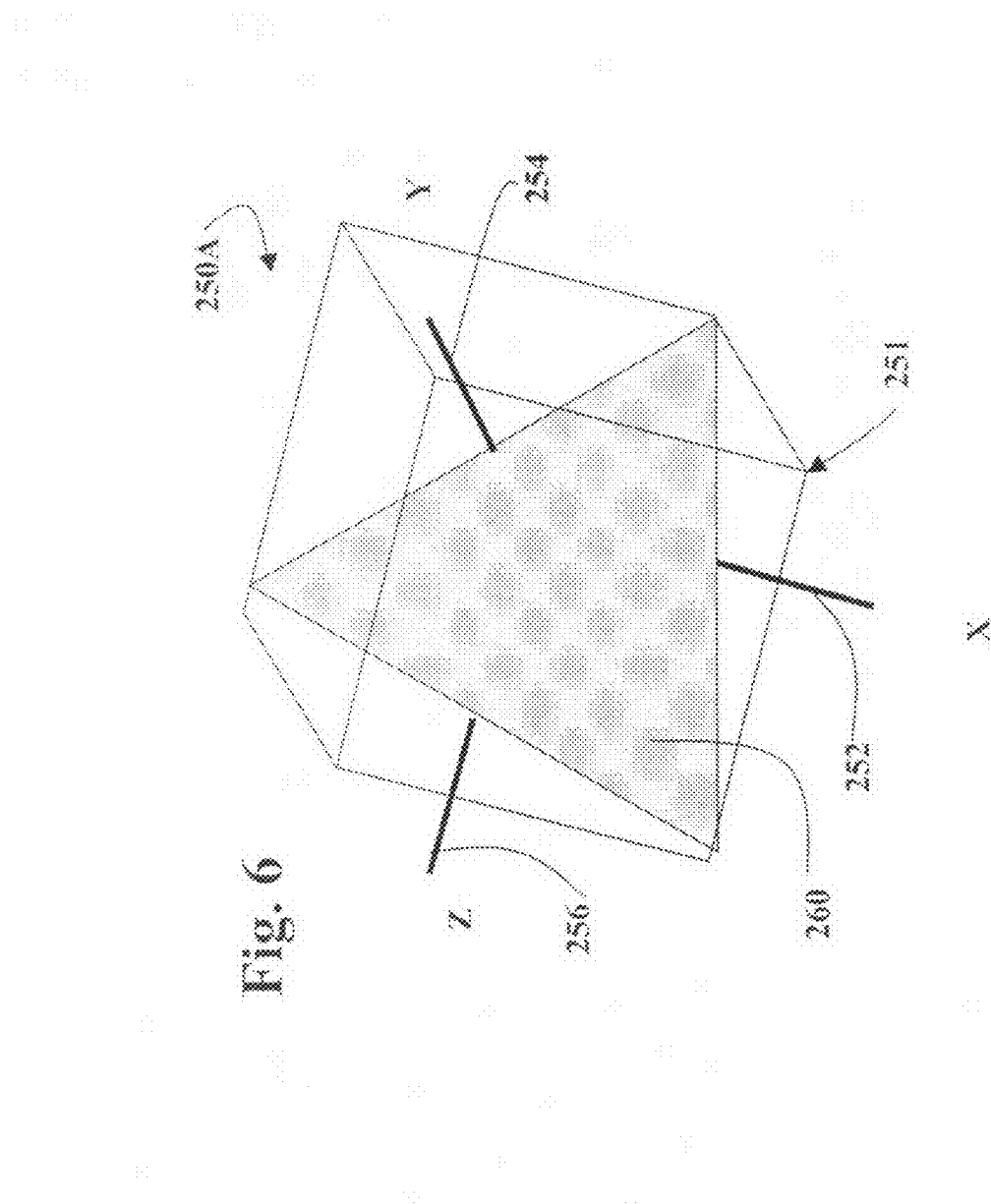

BROADBAND ISOTROPIC ANTENNA

Priority is claimed on Provisional Patent Application Ser. No. 60/994,305 filed 19 Sep. 2007.

FIELD OF THE INVENTION

The present invention relates to field strength monitoring antennas and systems, in particular to multiplexed 3-dimension omnidirectional (isotropic) antennas and monitoring systems.

BACKGROUND OF THE INVENTION

For many RF safety and regulatory applications there is a need to measure the RF field strength independently from the electro-magnetic field orientation in each X, Y and Z dimension. This requires an isotropic (omnidirectional) antenna. However, a single such antenna (to measure 3-dimensions) physically doesn't exist.

Many single axis antennas are called "isotropic" though they are not. For example, monopole antenna oriented in the direction Z, is "isotropic" if field source is rotated around Z-axis in the plane X-Y and field polarization coincides with antenna axis Z. But for the field polarization in the plane X-Y, signal of this antenna is zero, therefore such antenna is not isotropic.

In an attempt to overcome the single-plane limitation of a single-axis antenna (Ez), a user manually orients it in space to maximize the signal so that effectively E=Ez. However, for each frequency, in general, there will be a different antenna orientation producing the maximum signal. Therefore, for multiple signal sources and/or broad frequency range scanning this method becomes time consuming and actually inaccurate because it requires the operator to continuously manipulate the antenna at each frequency of interest. Also there is a possibility to skip some important signals due to unfavorable antenna orientation. The same techniques are applied to the magnetic field antennas, using instead a small single axis antenna loop antenna, where 'small' means size compared to the received signal wavelength.

More sophisticated method of creating the system, producing the response equivalent to the isotropic antenna, includes positioning three separate single axis antennas at mutually orthogonal positions (Ex, Ey, Ez) and then calculating the resulting field as $E=SQRT(Ex^2+Ey^2+Ez^2)$. Such approach requires a complicated antenna system with three identical RF channels of signal processing. An example 40 is shown in FIG. 1 where there are 3 orthogonal (X, Y and Z) antennas 42, 44, 46, and corresponding amplifiers 43, 45, 47, respectively, having a connection to the RF signal processing circuit 48, Corresponding Ex, Ey, Ez components of the field at a given point of space are measured sequentially in time via an RF Switch 50 having an output to EMI receiver 52 which provides an output to a readout circuit 54 synchronized with the RF switch 50 according to multiplexer control 56. The amplitude of the field magnitude $E=SQRT(Ex^2+Ey^2+Ez^2)$ is calculated by readout circuit 54 and displayed on display 58 along with the frequency of the signal selected by the EMI receiver. This antenna meets the "omnidirectionality" requirements for RF signals that change their amplitude slower then our ability to measure and calculate the field module.

If a broad spectrum of the field strength E at any frequency is to be scanned and displayed, the EMI receiver is replaced with spectrum analyzer. The problem that arises here is that antennas multiplexer and signal processing multiplexer need to be synchronized, that is when antenna X is connected to the antenna output the same "X" sampling circuit should be selected to measure and store the value of the Ex component of the field as shown in the example 60 of FIG. 2. The antenna module 62 contains three orthogonal 42, 44, 46 antennas, corresponding amplifiers 63, 65, 67 and RF switch 64 controlled by the multiplexer control circuit 76, located in the spectrum analyzer 70. The RF output from the RF switch 64 in the antenna module 62 comes through cable 66 while the multiplexer control circuit 76 control signal is sent to the antenna module 62 (and to the RF switch 64) though a separate cable or other separate connection. When spectrum analyzer 70, including a receiver 72 and readout circuit 74 (controlled by the multiplexer controller 76) sweeps the frequency range, at each frequency the components Ex, Ey and Ez are measured and the calculated field strength magnitude E is displayed. This approach has some disadvantages in that although system 60 imitates the performance of an isotropic antenna, it requires a special spectrum analyzer, with a special, separate second cable.

Considering that vast majority of the existing spectrum analyzers can't provide the special signal processing required by this antenna example 60 of FIG. 2, there continues to be a need for the omnidirectional antenna that has an RF output that can work with. ANY spectrum analyzer without the requirement of a special multiplexer controlled display and computation, and a second special cable to operate.

SUMMARY OF THE INVENTION

The present invention provides an antenna including 3 orthogonal field sensing elements, asynchronously multiplexed to a single RF signal output of the same frequency as original field signal at the antenna position but with amplitude equal to approximate $E=SQRT(Ex^2+Ey^2+Ez^2)$ to within +/−2.39 dB. The embodiments effectively provide an isotropic antenna (or antenna system) and together with a connected conventional processing system (e.g spectrum analyzer) form an isotropic field strength measuring system.

BRIEF DESCRIPTION OF THE DRAWING

These and further features of the present invention will be better understood by reading the following Detailed Description together with the Drawing, wherein

FIG. 6 is an orthogonal internal view of the design of the PCB disposed within the antenna head of the embodiment of FIG. 5.

DETAILED DESCRIPTION OF THE EXEMPLARY EMBODIMENTS

Figure 1:
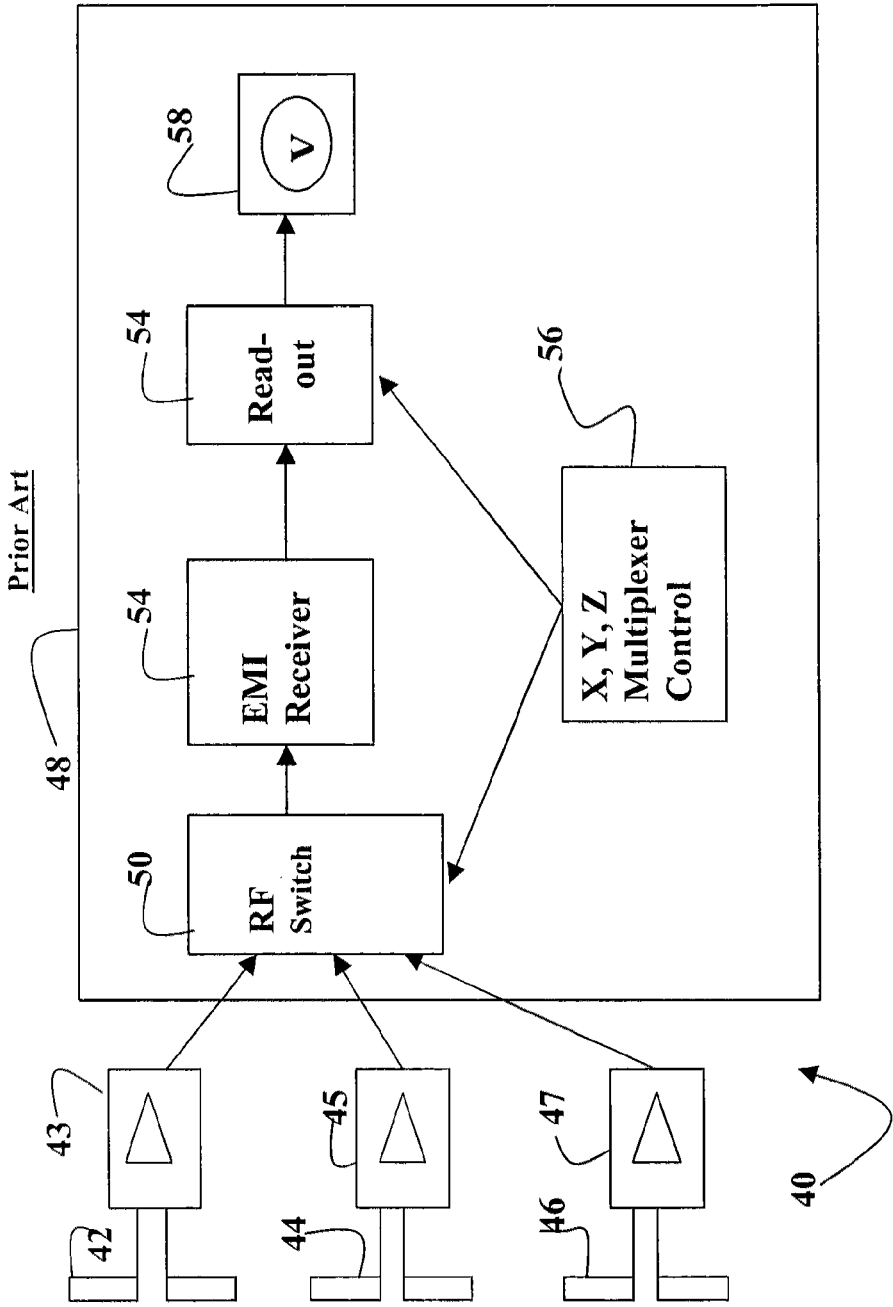
FIG. 1 is a block diagram of a first prior art configuration.
Figure 2:
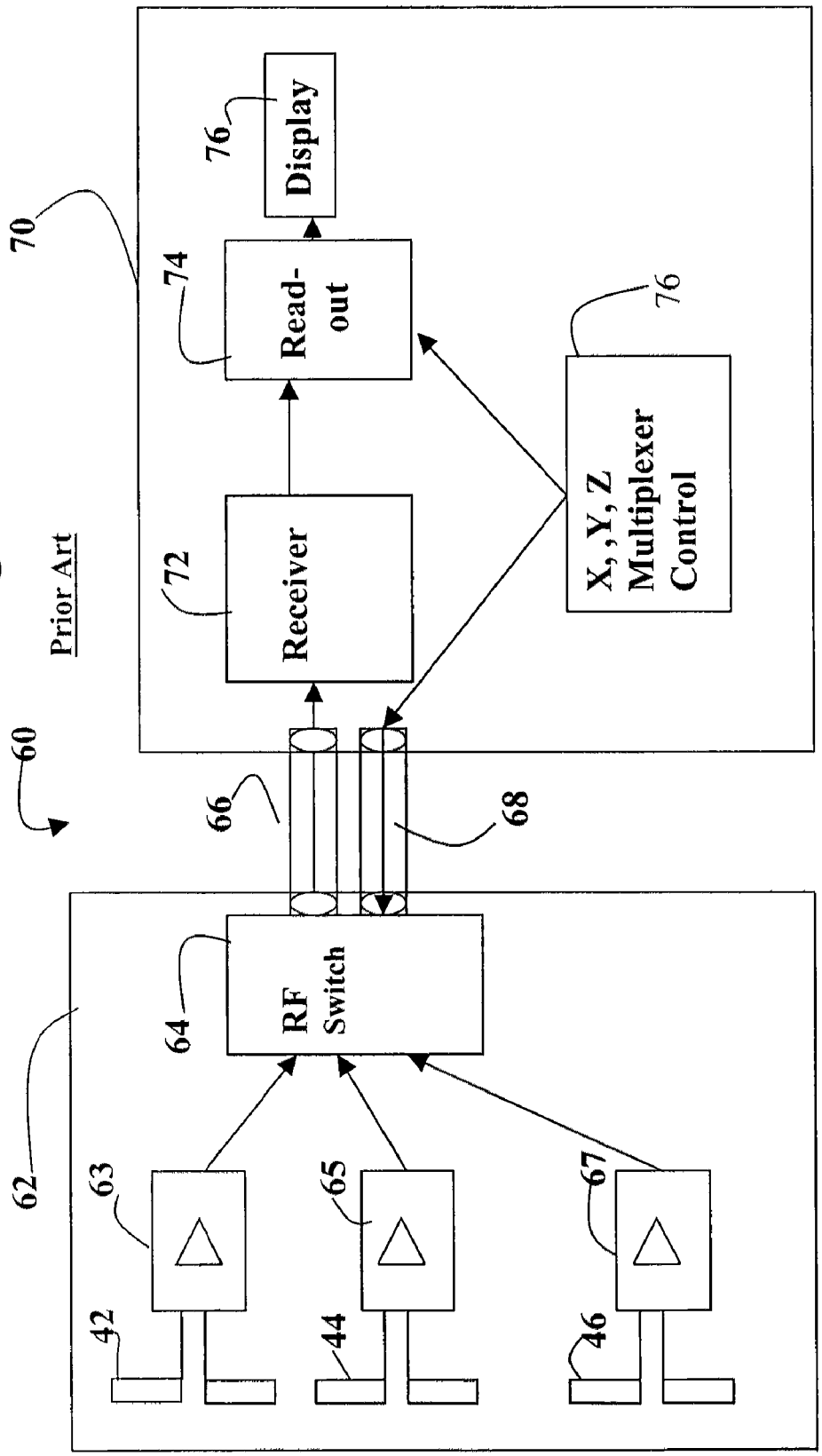
FIG. 2 is a block diagram of a second prior art configuration.
Figure 3:
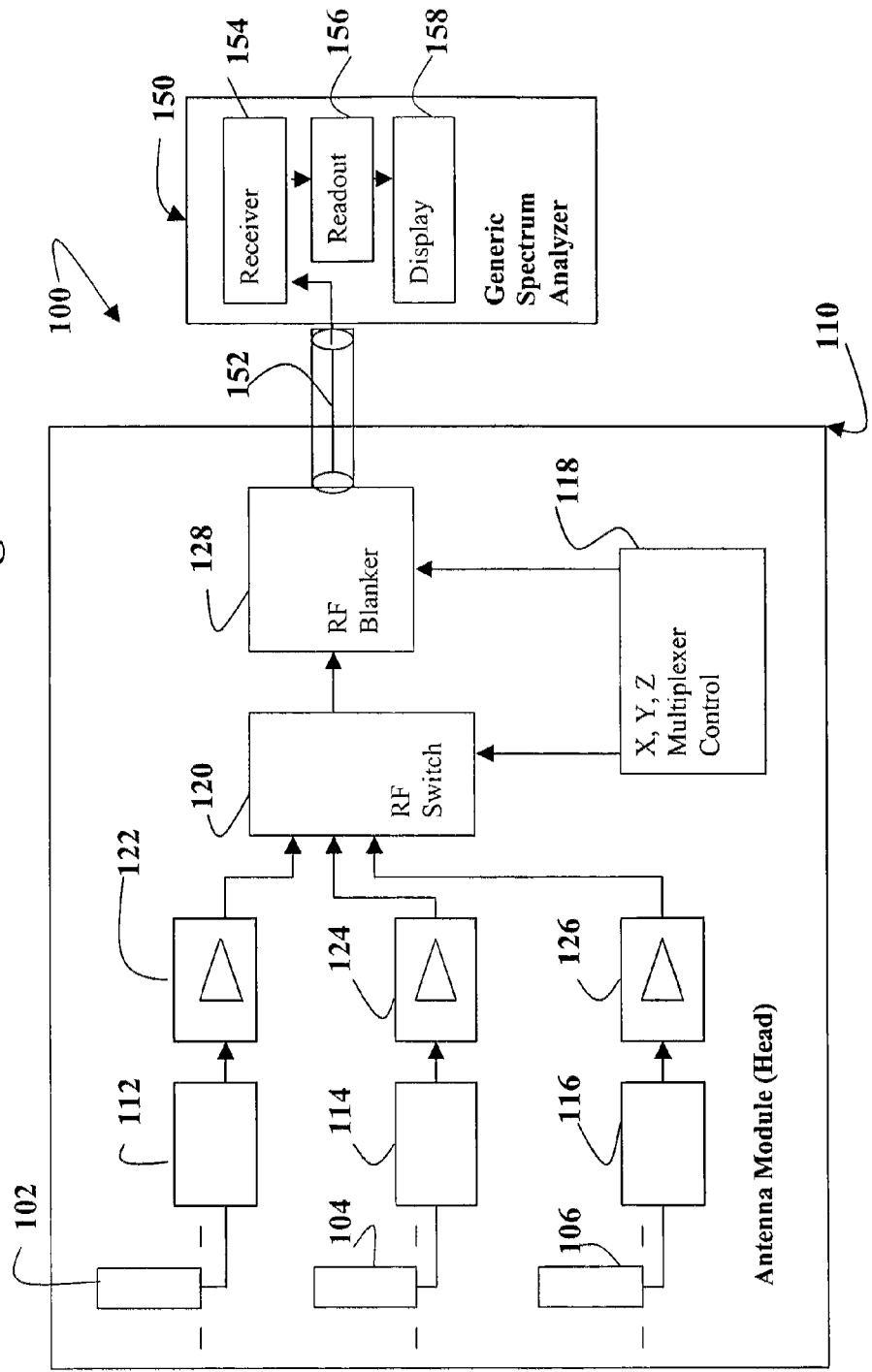
FIG. 3 is a block diagram of one exemplary embodiment of the present invention.

Consider in an exemplary embodiment of the present invention 100 of FIG. 3, that the antenna (102, 104, or 106) is isotropic in two dimensions (dipole, monopole) reacting to a field in one particular direction. This antenna can be also a small (relative to the measured frequency) loop antenna sensing the H-field. For an orthogonal 3-axis antenna system (antennas 102, 104, 106, we used a monopoles) where antennas produce the signals Ex, Ey, Ez, band-limited by the networks 112, 114, 116 to the passband of the expected band to be analyzed or scanned, and amplified by the amplifiers 122, 124 and 126, and received by the inputs of an RF switch (multiplexer) 120 and selectively connecting antenna signals to the antenna output according to the multiplexer control 118. The networks may also include active and passive devices to compensate for and make antenna factors (AF) to be more or less frequency independent. The multiplexer control 118 is typically clocked at a fixed rate, e.g. 1 kHz.

The X, Y, Z multiplexer switching with frequency Fm will cause the signal of frequency Fs to become amplitude modulated. This, in turn, will split the Fs creating the signal bands with frequencies Fs+/−Fm. In order to keep the "broadening" of the spectrum narrow we chose the switching frequency of the multiplexer to be relatively low, providing an 'on' time for each of the selected antenna signals of about 500 microseconds (uS), corresponding to a clock rate of about 1 Khz. For subsequently connected spectrum analyzers having a particular low frequency limit, the multiplexer switching (sampling) may occur below the spectrum analyzer low frequency limit. Also, the multiplexer asynchronously (relative to the spectrum analyzer) samples each independent RF signal. Alternate embodiments may include different clocking speeds, and may also include non-constant clock rates. The output of the antenna head 110 may be fed directly to the spectrum analyzer via cable 152, will typically represent Ex (⅓ of the time) Ey (⅓ of the time), Ez (⅓ of the time).

In the system embodiment 100 of FIG. 3, the blanker circuit 128 receives the output of the multiplexer and provides an output signal having some time of no signal during at least the short periods of time when RF switching occurs. This eliminates the switching noise and improves the signal to noise of the antenna. The blanking circuit includes circuitry to provide a more rounded or gradual signal turn-off and turn-on to minimize noise signal contributions from the switching action of the blanking circuit 128. For a multiplexer switching time of 500 uS per input, a typical blanking period may be 50 uS with the actual transition from one input to the next occurring in the center of the (50 uS) period.

Since the required magnitude of the output field is $$E=\text{SQRT}(Ex^2+Ey^2+Ez^2) \quad (1)$$

Lets consider the following approximation to the expression above:

$$Eout=\text{MAX}(Ex,Ey,Ez) \quad (2)$$

where MAX means—the maximum value of the three field components Ex, Ey, Ez. For many practical applications Eout and E are close to each other and a good approximation.

$$Eout \approx E \quad (3)$$

For example, if Ex=1 (in some units), Ey=Ez=0, E=Ex=1, and Eout=MAX(1,0,0)=1. Therefore, we see that for the electric field with direction coincident with one of the antennas, the Eout=E and the error is zero.

Maximum error happens when all three field components Ex, Ey, Ez are equal: Ex=Ey=Ez=1. Then E=SQRT(1+1+1)=SQRT(3)=1.73, and Eout=MAX(1,1,1)=1. In this case Eout=0.59*E. Here Eout is smaller than the required E by 1.73 times or by 4.77 dB. Therefore, the error of this approximation is in the range 0-4.77 dB. If we calibrate an embodiment according to the present invention right in the middle of this error, antenna will produce the RF signal corresponding to the module of the field vector E with error in the range +/−2.39 dB for any field orientation relative to the antenna module 110.

The antenna module output signal is then fed to the standard spectrum analyzer (SA) 150 via cable 152. When SA 150 is in the MAX/HOLD mode (here), it typically includes a peak detector (or equivalent) that has fast sampling time to detect the signal rise and long time of hold. Therefore, for the time multiplexed signal of present embodiment producing the sequential Ex, Ey, Ez, Ex, Ey, Ez . . . , etc. the SA 150 will display the MAX(Ex, Ey, Ez), that is exactly what our approximation is.

Moreover, the same happens in the typical "NORMAL" peak sampling mode. If SA 150 dwells at each frequency long enough to allow at least one of the Ex, Ey, Ez to be sampled by the antenna, it will show the maximum of Ex, Ey, Ez. Therefore, by slowing down the SA we will have the stable spectrum that will be the representation of $E=\text{SQRT}(Ex^2+Ey^2+Ez^2)$ with error less than +/−2.39 dB.

In a very typical situation in the RF safety monitoring applications, an antenna is often located in the proximity of one particular transmitter. As shown in an alternate embodiment 200 of FIG. 4, the accuracy of the output can be improved in cases where there is one dominant signal. The system 200 structure is similar to the FIG. 3 except the presence of the additional VGA (variable gain amplifier) 208 related and control related circuitry, e.g. multiplexer (and S/H) control circuit 220. In the embodiment 200, the magnitude of the field strength vector E can be computed in the antenna by measuring the field components Ex, Ey, Ez by detectors 212, 214, 216 that include circuitry to produce the corresponding signals $Ex^2$, $Ey^2$, $Ez^2$. The detectors 212, 214, 216 each provide output signal according to the square of the magnitude of the RF signal received, and can be implemented by diodes operating in the square law regions, by linear detectors followed by squaring circuits, or other implementations. The detector 212, 214, 216 output signals are followed by three sample and hold (S/H) circuits 222, 224, 226 and a summing circuit 228 producing the signal proportional to the $Ex^2+Ey^2+Ez^2$. A square root circuit 230 receives the summing circuit 228 output and provides an output corresponding to the magnitude of the field E.

A peak detector 234 receives the VGA 208 output signal and provides an output according to the magnitude X, Y, Z samples to a sample and hold (S/H) 236 which retains the peak value of the largest of X, Y and Z, which corresponds to MAX(Ex, Ey, Ez). In one embodiment, the S/H 236 has a decay rate of 1-10 msec; in alternate embodiments, the S/H is reset after a cycle of 3 or more sequential sample periods.

A comparator 232 compares the value of E according to the output of the square root circuit 228 to the S/H 236 output corresponding to MAX(Ex, Ey, Ez). Comparator 232, typically comprising an amplifier which provides range of output voltage, then controls the gain of the output variable gain amplifier (VGA) 208 with in a corresponding gain range to make Eout=E. The polarities of the comparator inputs are selected to allow the VGA 208 gain to decrease when the S/H 236 output (MAX) exceeds the square root circuit output (E). In the embodiment 200, such VGA 208 gain adjustment is typically limited to the range of the VGA gain is (1-1.73). The various S/H circuits (122, 124, 126, 222, 224, 226, 236) are controlled by the same control circuit 220 which controls the multiplexer (RF switch) circuit 120 to provide selectable synchronization of the circuits.

Figure 4:
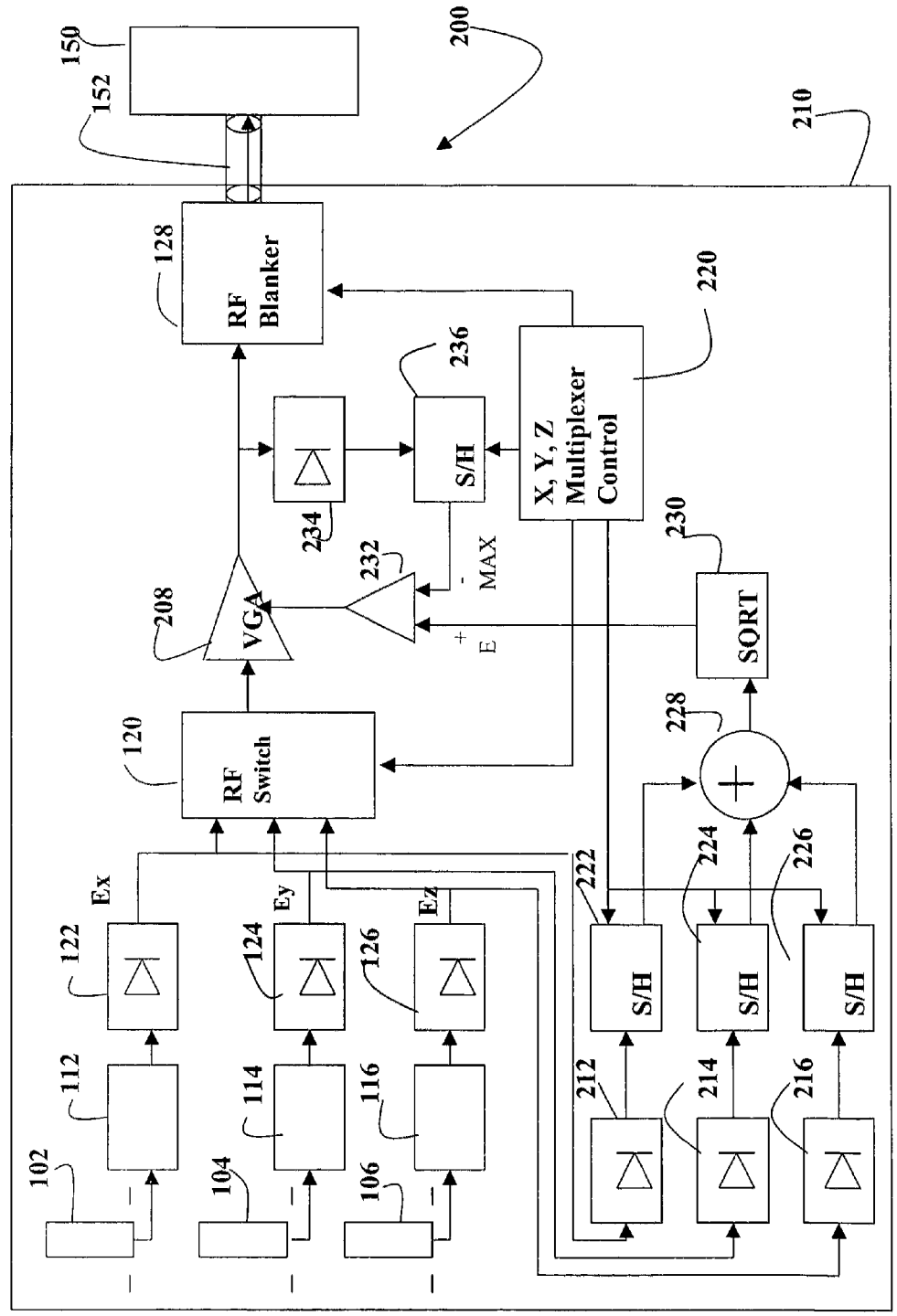
FIG. 4 is a block diagram of a second exemplary embodiment of the present invention.

The VGA control voltage can be turned off such as by bypassing the VGA 208 with a switch (not shown), or otherwise setting the VGA 208 gain to 1 making circuit 210 of FIG. 4 similar to the one at FIG. 3 resulting in the same antenna calibration for all small signals not affecting the components Ex, Ey, Ez fields. Also, a gain of +2.39 dB may be provided by the VGA 208 in addition to the gain in the range of 1-1.73, or the other blocks in the signal path, e.g. networks 112, 114, 116. This embodiment reduces the antenna error of the embodiment 100 of FIG. 3 to substantially zero for dominant RF signals.

Figure 5:
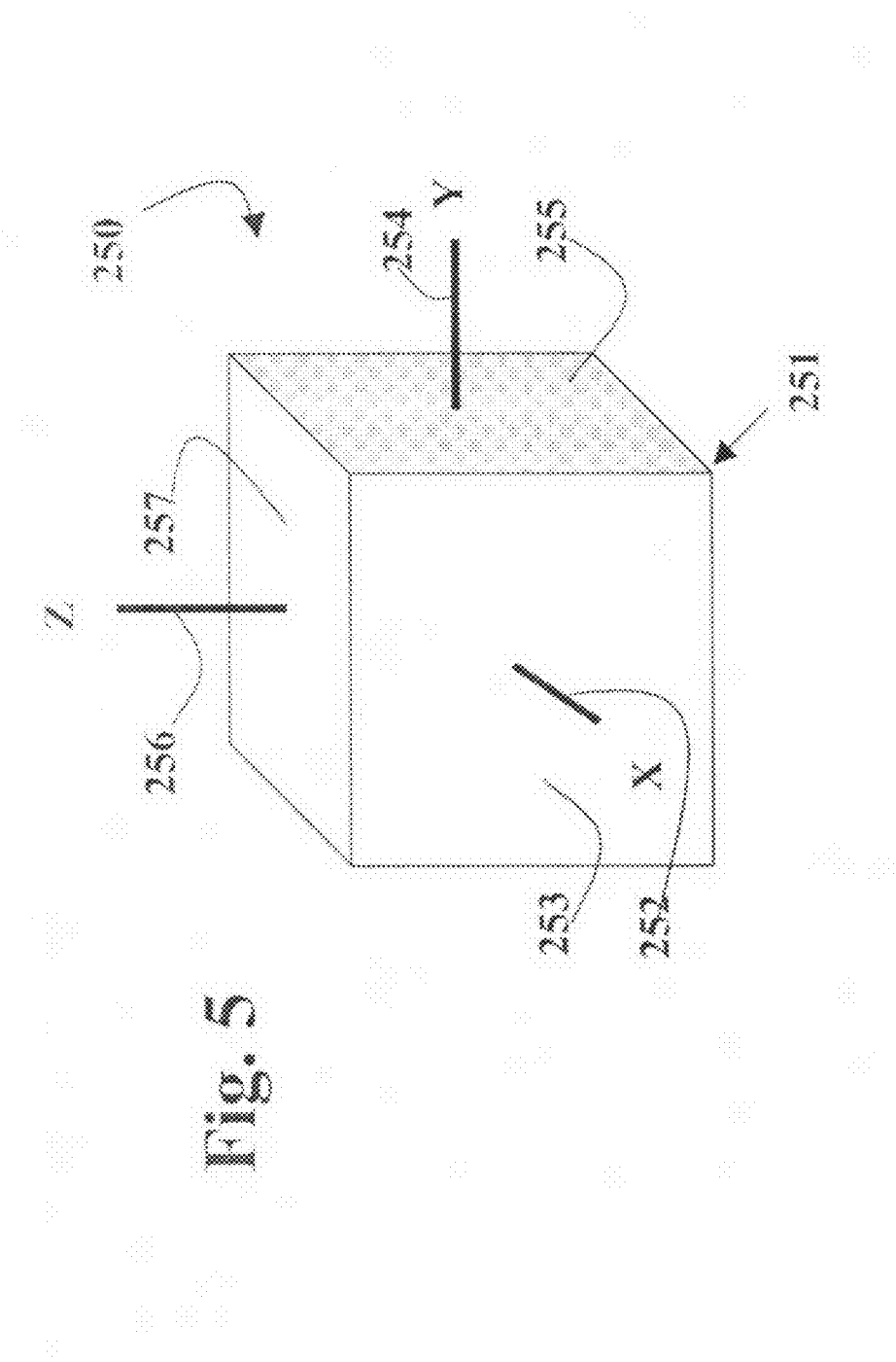
FIG. 5 is an orthogonal external view of one exemplary embodiment of the antenna head metal housing.

FIGS. 5 and 6 show the mechanical design of the antenna head 250. A cube housing 251, typically metal or other conductor, has three substantially identical antenna elements 252, 254, 256, e.g. wire for E fields, extending therefrom in orthogonal directions from corresponding surfaces 253, 255, 257. The connecting cable is not shown. The view of the antenna head 250A of FIG. 6 represents the housing 251 as transparent to reveal the disposition of a triangular planar circuit board 260 within the housing and diagonally transecting each of the X, Y and Z planes. Embodiments of the present invention may include all or portions of the related circuitry (e.g. 110) on the circuit board 260.

Typical antenna performance parameters are:
Frequency range 10 MHz-6 GHz
Field strength range: 1 mV/m-300 V/m
The monopole length is 10-30 mm
The antenna head cube size is 30-40 mm.

Other parameters are within the scope of the present invention to accommodate different spectrum portions, signal magnitudes, etc. The present invention further includes, or is adapted to work with large (wavelength size relative to frequency) and/or resonant antennas of similar characteristics and orthogonal orientation. The monopole (electrostatic) antennas may be replaced with orthogonal loop or other (electromagnetic) field-sensing elements. The exemplary inclusion of a spectrum analyzer may be replaced by another spectrum processing device. Further modifications and substitutions are within the scope of the present invention which is not to be limited except by the claims which follow.

What is claimed is:

1. A method of measuring isotropic signals, comprising the steps of:
    providing a plurality of independent RF signals from a corresponding orthogonal antenna;
    sampling each said independent signal at a selected time period per signal and having a combined, time-multiplexed RF output therefrom; and
    analyzing said RF output signal as an unseparated sequence of multiplexed independent RF signals with a spectrum processor; and
    calculating MAX(Ex, Ey, Ez) by said spectrum processor.

2. The method of claim 1, wherein said step of sampling comprises the step of sampling asynchronously relative to said spectrum processor each said independent signal in a fixed sequence.

3. The method of claim 2, wherein said spectrum processor has a spectrum bandwidth having a low frequency limit, for which said output signal is analyzed, said step of sampling includes the step of sampling at a rate below said spectrum low frequency limit.

4. The method of claim 1, further including the step of blanking said output prior to delivery to said spectrum processor at a transition time corresponding to change of independent signal sampled.

5. The method of claim 1, where said step of analyzing includes the step of operating said spectrum processor in one of peak and hold mode.

6. The method of claim 1, wherein the step of providing a plurality of independent signals from a corresponding orthogonal antenna further includes the step of providing 3 orthogonal antennas on a common support.

7. The method of claim 6, further including the step of providing a triangular circuit board disposed relative to said common support having thereon electrical connection to antenna feed points of said 3 orthogonal antennas.

8. The method of claim 1, further including the step of providing said output to said spectrum processor in a single cable, and
    providing operating power at least to circuitry providing said step of sampling.

9. The method of claim 1, further including the steps of:
    computing the magnitude of the field strength vector produced by the independent signals including orthogonal related signals Ex, Ey and Ez, each squared to produce $Ex^2$, $Ey^2$ and $Ez^2$, summed, and having a square root taken therefrom, and
    adjusting the amplitude of said sampling output thereof according to a control signal related to said square root and providing a corresponding variable gain amplifier output signal.

10. The method of claim 9, further including the step of comparing said adjusted sampling output signal to said square root and providing said control signal to adjust the amplitude of said sampling output signal to provide said variable gain output signal magnitude substantially equal to said square root.

11. The method of claim 10, further including the step of providing a multiplexer-synchronized sample & hold circuit to provide a synchronously sampled variable gain amplifier output signal for said step of comparing.

12. Apparatus for measuring isotropic signals, comprising:
    an input to receive independent orthogonal RF signals;
    a multiplexer connected to receive said independent orthogonal RF signals and provide therefrom according to a multiplexer control signal, a single RF output signal comprising a selected sample of each said independent signal; and
    means for providing said RF output signal to a spectrum processor; and
    apparatus for computing the magnitude of the field strength vector produced by the independent signals including orthogonal related signals Ex, Ey and Ez, each squared to produce $Ex^2$, $Ey^2$ and $Ez^2$, summed, and having a square root taken therefrom, and
    a variable gain amplifier for controlling amplitude of the sampling output thereof according to a control signal related to said square root and providing a corresponding variable gain amplifier output signal.

13. The apparatus of claim 12, wherein said multiplexer comprises a multiplexer adapted to provide an asynchronously multiplexed single output signal from a fixed sequence of samplers of said independent orthogonal signals.

14. The apparatus of claim 13, wherein said spectrum processor has a spectrum bandwidth having a low frequency limit, for which said RF output signal is analyzed, said multiplexer samples a rate below said spectrum low frequency limit.

15. The apparatus of claim 12, further including a blanker receiving said multiplexer RF output signal and providing to said spectrum processor an absence of sampled signals substantially corresponding to a time of transition a sample from one independent orthogonal signal to the next.

16. The apparatus of claim 12, wherein said spectrum processor is operable in one of peak and hold mode, and further includes means for calculating MAX(Ex, Ey, Ez).

17. The apparatus of claim 12, further including a plurality of orthogonal antennas connected to said input, and a common support for said orthogonal antennas.

18. The apparatus of claim 17, further including a triangular circuit board disposed relative to said common support and having a plane different from each plane of each of said 3 orthogonal antennas and including thereon connection to the feed points of said 3 orthogonal antennas.

19. The apparatus of claim 12, further including
a comparator receiving said variable gain amplifier output signal and said square root and providing said control signal to said variable gain amplifier according to the difference thereof to adjust the gain of said variable gain amplifier to provide said variable gain output signal magnitude equal to said square root.

20. The apparatus of claim 19, further including a sample & hold circuit connected to receive said multiplexer control signal to provide a multiplexer-synchronized sampled signal of said variable gain amplifier output signal to said comparator.

\* \* \* \* \*